(12) United States Patent
Yamazaki

(10) Patent No.: US 6,335,242 B1
(45) Date of Patent: Jan. 1, 2002

(54) METHOD FOR FABRICATING SEMICONDUCTOR DEVICE HAVING A HSG LAYER

(75) Inventor: Yasushi Yamazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/315,143

(22) Filed: May 20, 1999

(30) Foreign Application Priority Data

May 20, 1998 (JP) .................................................. 10-137933

(51) Int. Cl.⁷ ................................................ H01L 21/8242
(52) U.S. Cl. ................................................ 438/255; 438/398
(58) Field of Search .................................. 438/255, 398, 438/238–240, 253–254, 381, 396–397

(56) References Cited

U.S. PATENT DOCUMENTS

| | | | |
|---|---|---|---|
| 5,290,729 A | | 3/1994 | Hayashide et al. |
| 5,623,243 A | * | 4/1997 | Watanabe et al. ............ 257/309 |
| 5,639,689 A | * | 6/1997 | Woo |
| 5,910,019 A | * | 6/1999 | Watanabe et al. ............ 438/488 |
| 5,897,352 A | * | 8/1999 | Lin et al. ....................... 438/255 |
| 5,943,584 A | * | 8/1999 | Shim et al. .................... 438/398 |
| 5,960,281 A | * | 9/1999 | Nam et al. .................... 438/255 |

FOREIGN PATENT DOCUMENTS

| | | |
|---|---|---|
| JP | 3-263370 | 11/1991 |
| JP | 5-304273 | 11/1993 |
| JP | 6-5805 | 1/1994 |
| JP | 6-314774 | 11/1994 |
| JP | 7-142598 | 6/1995 |
| JP | 8-46151 | 2/1996 |
| JP | 10-22467 | 1/1998 |
| JP | 10-70249 | 3/1998 |

* cited by examiner

*Primary Examiner*—Jey Tsai
(74) *Attorney, Agent, or Firm*—McGinn & Gibb, PLLC

(57) ABSTRACT

In a method for fabricating a semiconductor device including a stacked structure memory cell having a transistor and a capacitor stacked over the transistor, a lower electrode of opposing electrodes of the capacitor is formed by forming a high-concentration impurity-doped amorphous silicon layer on an interlayer insulator film and patterning the amorphous silicon layer into an electrode shape, generating crystal nuclei on a surface of the patterned amorphous silicon layer and growing the crystal nuclei to form crystalline grains of silicon on an upper surface and a side surface of the patterned amorphous silicon layer, and forming a high-concentration impurity-doped polysilicon film on the crystalline grains and the amorphous silicon layer. Thus, the impurity concentration at the surface of the crystalline grains is compensated for. As a result, a stacked capacitor having less bias voltage dependency of the capacitance can be obtained.

22 Claims, 6 Drawing Sheets

*Fig. 9A*
*PRIOR ART*

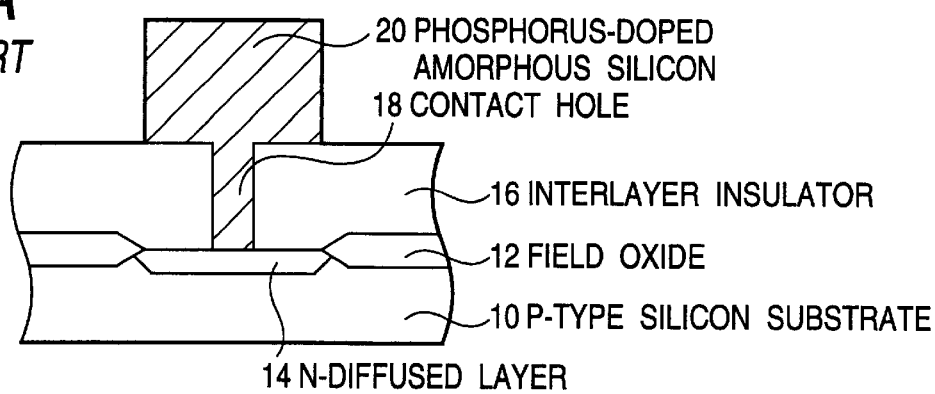

- 20 PHOSPHORUS-DOPED AMORPHOUS SILICON
- 18 CONTACT HOLE
- 16 INTERLAYER INSULATOR
- 12 FIELD OXIDE
- 10 P-TYPE SILICON SUBSTRATE
- 14 N-DIFFUSED LAYER

*Fig. 9B*
*PRIOR ART*

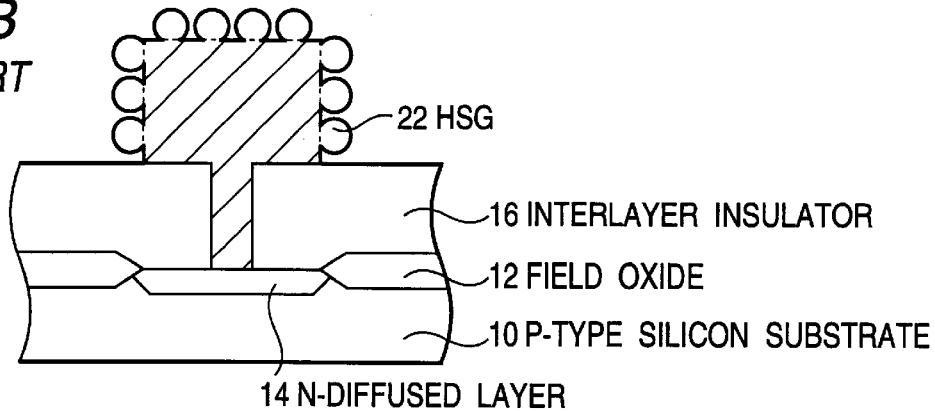

- 22 HSG
- 16 INTERLAYER INSULATOR
- 12 FIELD OXIDE
- 10 P-TYPE SILICON SUBSTRATE
- 14 N-DIFFUSED LAYER

*Fig. 9C*
*PRIOR ART*

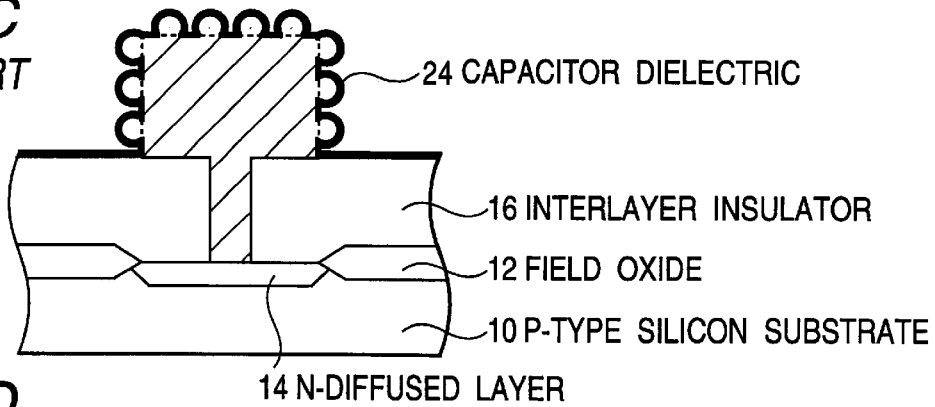

- 24 CAPACITOR DIELECTRIC
- 16 INTERLAYER INSULATOR
- 12 FIELD OXIDE
- 10 P-TYPE SILICON SUBSTRATE
- 14 N-DIFFUSED LAYER

*Fig. 9D*
*PRIOR ART*

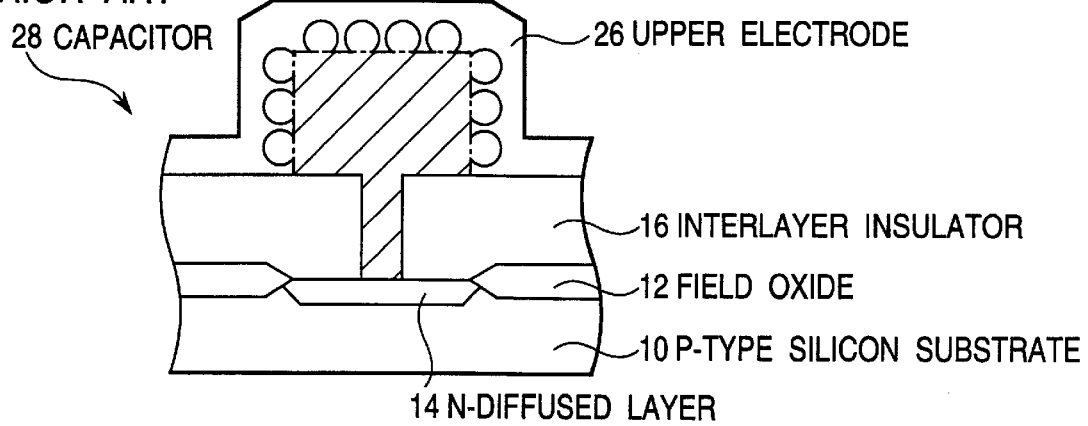

- 28 CAPACITOR
- 26 UPPER ELECTRODE
- 16 INTERLAYER INSULATOR
- 12 FIELD OXIDE
- 10 P-TYPE SILICON SUBSTRATE
- 14 N-DIFFUSED LAYER

METHOD FOR FABRICATING SEMICONDUCTOR DEVICE HAVING A HSG LAYER

BACKGROUND OF THE INVENTION

1. Field of the Invention

The present invention relates to a semiconductor device, and more specifically to a structure of a stacked capacitor type memory cell and a method for forming the same.

2. Description of Related Art

Recently, with an increased integration density of a DRAM (dynamic random access memory), a cell size has reduced, so that there is an inclination that an occupying area of a DRAM cell is reducing as 1.6 $\mu m^2$ in 64 Mbit DRAM and 0.7 $\mu m^2$ in 256 Mbit DRAM. Therefore, in order to ensure a sufficient capacitance of a capacitor, a stacked capacitor is used which can increase a capacitor surface area per an occupying area. Ordinarily, the stacked capacitor is stacked over a transfer gate transistor.

In the DRAM cell having the above mentioned stacked capacitor structure, in order for the capacitor to have the capacitance required for an operation, it is demanded to increase the area of opposing electrodes of the capacitor. To meet this demand, a method of forming convexes and cancaves on the surface of the electrodes is adopted.

Japanese Patent Application Pre-examination Publication No. JP-A03-263370 and its corresponding U.S. Pat. No. 5,290,729 (the content of which is incorporated by reference in its entirety into this application) disclosed a technology for forming convexes and cancaves on the surface of a lower electrode. According to this technology, a silicon layer having a concavo-convex surface is formed on the whole of the surface of a silicon substrate, and a phosphorus-doped polysilicon layer is formed on the silicon layer. Then, a heat treatment is conducted to cause the phosphorus contained in the polysilicon layer to diffuse into the inside of the silicon layer so that the silicon layer acquires electric conductivity. Thereafter, the stacked layer of the polysilicon layer and the silicon layer is patterned into a shape of an electrode, so that a lower electrode having convexes and cancaves on an upper surface is formed.

In this prior art lower electrode, however, only the upper surface has the convexes and cancaves, and a side surface of the lower electrode is flat. There is a limit in increasing the electrode area by forming the convexes and cancaves on only the upper surface.

Under this circumstance, Japanese Patent Application Pre-examination Publication No. JP-A-05-304273 (now, Japanese Patent No. 2,508,948, and an English abstract of JP-A-05-304273 is available and the content of the English abstract is incorporated by reference in its entirety into this application) proposes a method for forming a polysilicon as a capacitor electrode in the DRAM cell, this method enabling to form the convexes and cancaves on not only the upper surface but also the side surface, thereby to increasing the electrode surface area.

Now, the method for forming the DRAM cell in accordance with this proposed method will be described with reference to FIGS. 9A to 9D, which are diagrammatic sectional views for illustrating the process for forming the DRAM cell in accordance with the proposed method. In these figures, as regards a transistor part, there is shown only an N-diffused layer 14 acting a source region (or electrode) and formed in a transistor forming zone confined by a field oxide film 12 formed on a P-type silicon substrate 10.

As shown in FIG. 9A, over the transistor, an interlayer insulator film 16 is formed, and an contact hole 18 is formed in the interlayer insulator film 16 at a position of the N-diffused layer 14. An amorphous silicon layer 20 containing a high concentration of phosphorus is formed in the inside of the contact hole 18 and on an upper surface of the interlayer insulator film 16, and then, the amorphous silicon layer 20 is patterned by a lithography and a dry etching.

Then, as shown in FIG. 9B, a disilane ($Si_2H_6$) is irradiated while heat-treating the patterned phosphorus-doped amorphous silicon layer 20 in a high vacuum condition, so that silicon crystal nuclei are generated. This is because the disilane is decomposed at dangling bonds existing at a surface of the amorphous silicon layer, so as to generate crystal nuclei. Succeedingly, the heat-treatment is continuously performed in the high vacuum condition, so that crystal nuclei grow to mushroom-shaped crystalline grains 22 having a drain diameter of 60 nm to 70 nm. In the following, this crystalline grain 22 will be called a HSG (hemi-spherical (silicon crystalline) grain). Thus, a lower electrode having convexes and concaves of HSGs on an upper surface and a side surface of the phosphorus-doped amorphous silicon is formed.

Thereafter, as shown in FIG. 9C, a silicon nitride (SiN) film is formed on the lower electrode to form a capacitor dielectric film 24. Furthermore, as shown in FIG. 9D, a polysilicon layer containing a high concentration of phosphorus is formed, and phosphorus is doped so as to form an upper electrode 26. Thus, a stacked capacitor 28 is fabricated.

However, the stacked capacitor having the lower electrode the convexes and concaves of HSGs on the upper surface and the side surface of the phosphorus-doped amorphous silicon, has the following problem:

Namely, the HSGs has the nature of growing while discharging the impurity (phosphorus) contained therein- As a result, the post-grow HSGs are formed of non-doped silicon. This means that a surface of the lower electrode is depleted. Therefore, as shown in FIG. 10, the bias voltage dependency of the capacitance of the capacitor becomes remarkable, so that when the potential of the lower electrode is high, the capacitance substantially drops. Incidentally, in FIG. 10, the axis of abscissas indicates the bias voltage V of the upper electrode when it is compared with the voltage of the lower electrode as a reference. Assuming that when the bias voltage is 0 (zero) the capacitance is expressed as Csmax, when the bias voltage becomes minus, namely, when the potential of the lower electrode becomes high, the width of the depletion layer increases with the result that the amount of stored charges decreases and therefore the holding characteristics is deteriorated. Therefore, as shown in FIG. 10, when the bias voltage V of the upper electrode is at −1.5 V, the ratio of the capacitance Cs to Csmax drops to 0.7. As such, the capacitance of the capacitor depends upon the bias voltage.

The above mentioned bias voltage dependency of the capacitance is directly attributable to the non-doped condition of the surface polysilicon film after the HSG growth. In addition to this cause, since the temperature of a heat treatment in later steps has lowered with an advanced microfabrication of the design rule, the impurity contained in a high-concentration doped layer constituting the lower electrode has become hardly to re-diffuse into the HSGs after the HSG growth.

SUMMARY OF THE INVENTION

Accordingly, it is an object of the present invention to provide a stacked capacitor and a method for forming the same, which have overcome the above mentioned defect of the conventional one.

Another object of the present invention is to provide a stacked capacitor having less bias voltage dependency of the capacitance, and a method for forming the same.

A further object of the present invention is to provide a memory cell having the above mentioned stacked capacitor having less bias voltage dependency of the capacitance, and a method for fabricating the same.

The above and other objects of the present invention are achieved in accordance with the present invention by the conception of the present invention that the depletion of the lower electrode surface can be minimized if it is possible to compensate for the loss of impurity at the surface of the mushroom-shaped crystalline grains formed of polysilicon and formed on the upper surface and the side surface of the lower electrode formed of impurity-doped polysilicon.

The compensating method includes three approaches. A first approach is to form a high-concentration impurity-doped polysilicon film on the surface of the lower electrode including the mushroom-shaped crystalline grains. A second approach is to heat-diffuse the impurity into the mushroom-shaped crystalline grains. A third approach is to ion-implant the impurity into the mushroom-shaped crystalline grains.

Accordingly, according to a first aspect of the present invention there is provided a method for fabricating a semiconductor device including a stacked structure memory cell having a transistor and a capacitor stacked over the transistor, comprising the steps of (a) forming a high-concentration impurity-doped amorphous silicon layer on an interlayer insulator film and patterning the amorphous silicon layer into an electrode shape, (b) generating crystal nuclei on a surface of the patterned amorphous silicon layer and growing the crystal nuclei to form crystalline grains of silicon on an upper surface and a side surface of the patterned amorphous silicon layer, and (c) compensating for the impurity concentration at a surface of the crystalline grains.

The above step (c) includes the step of forming a high-concentration impurity-doped polysilicon film on the crystalline grains and the amorphous silicon layer. Alternatively, the step (c) includes die step of heat-diffusing the impurity into the crystalline grains from the amorphous silicon layer. Further alternatively, the step (c) includes the step of ion-implanting the impurity into the crystalline grains.

According to a second aspect of the present invention there is provided a semiconductor device including a stacked structure memory cell having a transistor and a capacitor stacked over the transistor, wherein a lower electrode of opposing electrodes of the capacitor has a high-concentration impurity-doped amorphous silicon layer formed on an interlayer insulator film and having crystalline grains on an upper surface and a side surface thereof, and a high-concentration impurity-doped polysilicon film formed on the high-concentration impurity-doped amorphous silicon layer.

According to a third aspect of the present invention there is provided a method for forming a capacitor over an insulating film, wherein a lower electrode of opposing electrodes of the capacitor is formed by forming a high-concentration impurity-doped amorphous silicon layer on the insulating film and patterning the amorphous silicon layer into an electrode shape, generating crystal nuclei on a surface of the patterned amorphous silicon layer and growing the crystal nuclei to form crystalline grains of silicon on an upper surface and a side surface of the patterned amorphous silicon layer, and compensating for the impurity concentration at a surface of the crystalline grains.

According to a fourth aspect of the present invention there is provided a capacitor formed over an insulating film, wherein a lower electrode of opposing electrodes of the capacitor has a high-concentration impurity-doped amorphous silicon layer formed on the insulating film and having crystalline grains on an upper surface and a side surface thereof, and a high-concentration impurity-doped polysilicon film formed on the high-concentration impurity-doped amorphous silicon layer.

The above and other objects, features and advantages of the present invention will be apparent from the following description of preferred embodiments of the invention with reference to the accompanying drawings.

BRIEF DESCRIPTION OF THE DRAWINGS

FIGS. 9A to 9D are diagrammatic section views of illustrating the prior art method for fabricating the prior art stacked structure DRAM cell.

DESCRIPTION OF THE PREFERRED EMBODIMENTS

Figure 1A:
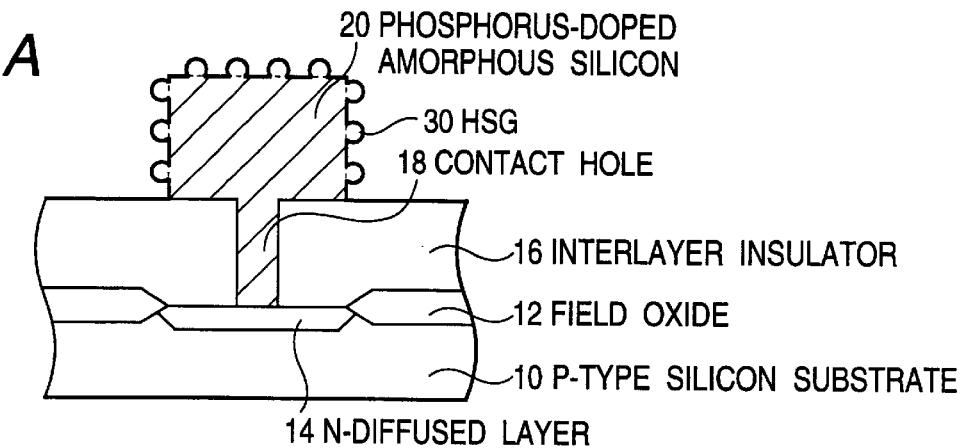
FIGS. 1A to 1D are diagrammatic section views of illustrating a first embodiment of the method in accordance with the present invention, for fabricating a first embodiment of the stacked structure DRAM cell in accordance with the present invention.

Now, embodiments of the present invention will be described with reference to the accompanying drawings.

Embodiment 1

Referring to FIGS. 1A to 1D, there are shown diagrammatic section views of illustrating a first embodiment of the method in accordance with the present invention, for fabricating a first embodiment of the stacked structure DRAM cell in accordance with the present invention. In these figures, as regards a transistor part, there is shown only an N-diffused layer 14 acting a source region (or electrode) and formed in a transistor forming zone confined by a field oxide film 12 formed on a P-type silicon substrate 10.

Over the transistor, an interlayer insulator film 16 is formed, and an contact hole 18 is formed in the interlayer insulator film 16 to reach the N-diffused layer 14. An amorphous silicon layer 20 containing a high concentration of phosphorus and having a thickness of 700 nm is formed in the inside of the contact hole 18 and on an upper surface of the interlayer insulator film 16 by use of a LPCVD (low pressure chemical vapor deposition) process. Then, the phosphorus-doped amorphous silicon layer 20 is patterned by a lithography and a dry etching. This patterned phosphorus-doped amorphous silicon layer 20 may be circular, square or rectangular in a sectional shape parallel to the substrate. Here, a ratio of an upper surface area to a side surface area is preferred to be not greater than ¼, in order to integrate the DRAM cells at a high density and in order to restrict the drop of the total capacitance of the capacitor at a value of not greater than 10%, even if an effective capacitor area of the upper surface of the patterned amorphous silicon layer 20 is reduced to ½ by a dry etching which will be explained hereinafter.

Next, in a ultra-high vacuum CVD apparatus, a disilane ($Si_2H_6$) is irradiated on the substrate while heat-treating the substrate in a high vacuum condition at a temperature of 500° C. to 600° C., so that silicon crystal nuclei are generated on a surface of the patterned phosphorus-doped amorphous silicon layer 20. Succeedingly, the heat-treatment is continuously performed in the high vacuum condition, so that HSGs 30 having a drain diameter of 30 nm to 40 nm are grown by adjusting the heat-treatment to for example 10 minutes to 15 minutes. Thus, as shown in FIG. 1A, a lower electrode having convexes and concaves of HSGs on the upper surface and the side surface of the patterned phosphorus-doped amorphous silicon layer 20 is formed.

Figure 1B:
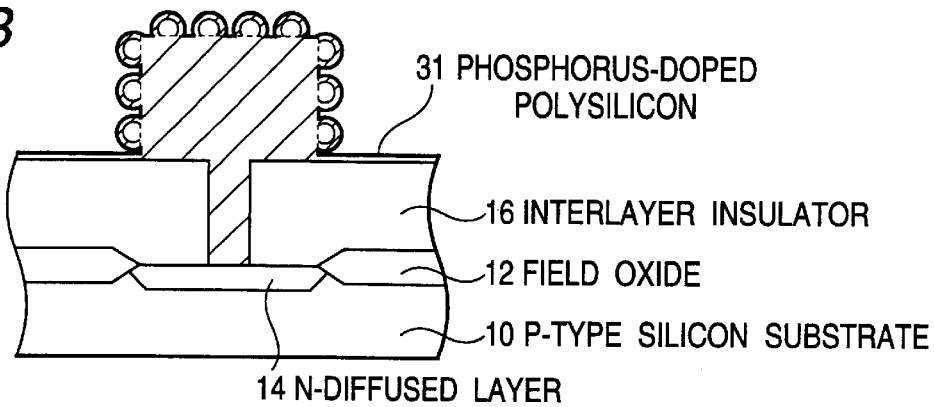

Then, over this structure, a polysilicon film 31 having a thickness of 10 nm to 20 nm and containing a high concentration of phosphorus (for example, on the order of $2 \times 10^{20} cm^{-3}$ to $3 \times 10^{20} cm^{-}$) is formed by the LPCVD process. As shown in FIG. 1B, this phosphorus-doped polysilicon film 31 is formed on the upper surface and the side surface of the patterned phosphorus-doped amorphous silicon layer 20 having the HSGs and the upper surface of the interlayer insulator film 16.

Figure 1C:
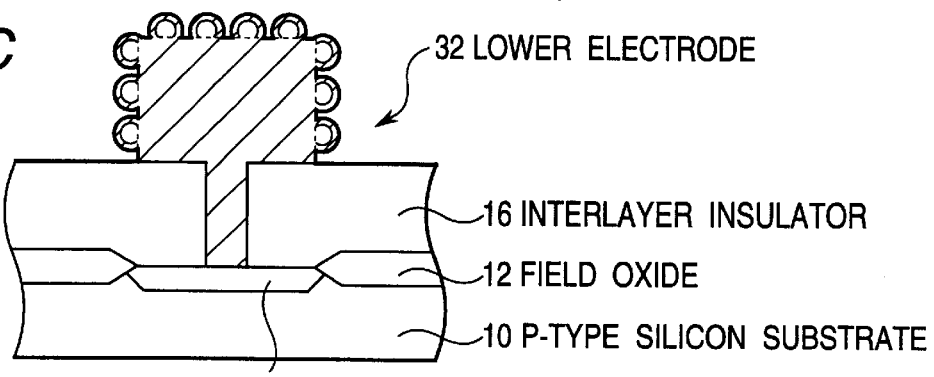

Thereafter, the whole surface etching-back is carried out by a dry etching to remove the phosphorus-doped polysilicon film 31 from the upper surface of the interlayer insulator film 16, as shown in FIG. 1C. Thus, a lower electrode 32 is formed. Incidentally, when the high-concentration phosphorus-doped polysilicon film 31 is formed by the LPCVD process, if the film 31 is selectively formed on only the upper surface and the side surface of the patterned phosphorus-doped amorphous silicon layer 20 having the HSGs, the succeeding dry etching for the etching back is no longer necessary.

Figure 1D:
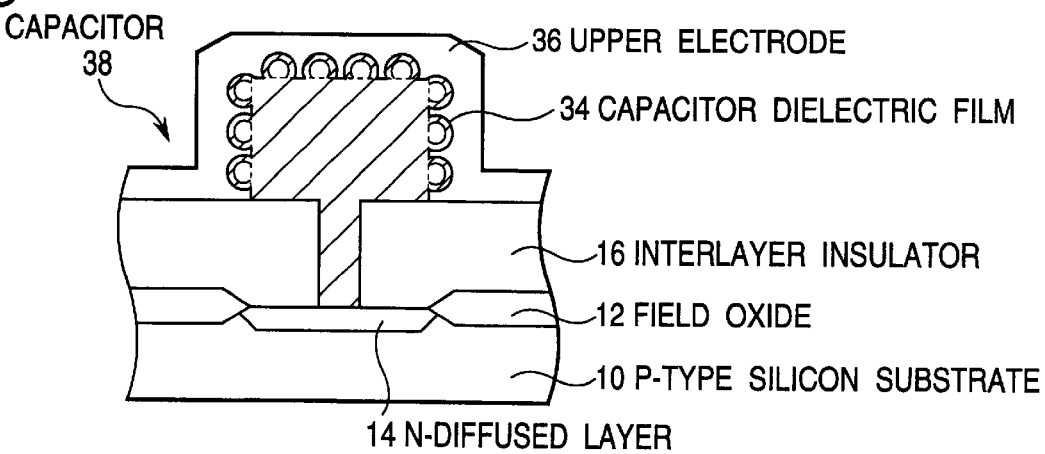

Then, as shown in FIG. 1D, a silicon nitride (SiN) film having a thickness of 8 nm is formed on the lower electrode to form a capacitor dielectric film 34, and succeedingly, a polysilicon layer containing a high concentration of phosphorus (for example, on the order of $2 \times 10^{20} cm^{-}$) is formed by the LPCVD process to form an upper electrode 36. Thus, a stacked capacitor 38 is fabricated.

Embodiment 2

FIGS. 2A to 2D are diagrammatic section views of illustrating a second embodiment of the method in accordance with the present invention, for fabricating a second embodiment of the stacked structure DRAM cell in accordance with the present invention. This Embodiment 2 is different from the Embodiment 1 in that HSGs grown on the whole surface and succeedingly a polysilicon film containing a high concentration of phosphorus is formed on the whole surface, and thereafter, the whole surface etching-back is carried out by a dry etching to remove the HSGs and the polysilicon film from the upper surface of the interlayer insulator film. Therefore, explanation of that which is the same as that of the Embodiment 1 will be omitted.

Figure 2A:
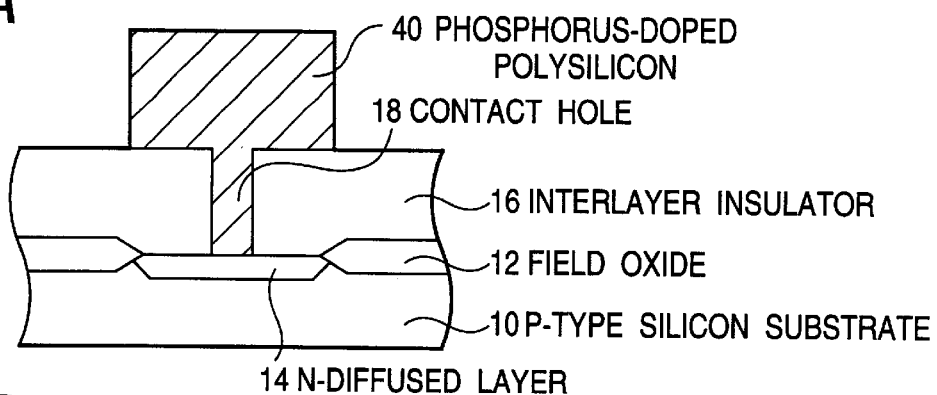
FIGS. 2A to 2D are diagrammatic section views of illustrating a second embodiment of the method in accordance with the present invention, for fabricating a second embodiment of the stacked structure DRAM cell in accordance with the present invention.

As shown in FIG. 2A, a polysilicon layer 40 containing a high concentration of phosphorus and having a thickness of 700 nm is formed in the inside of the contact hole 18 and on an upper surface of the interlayer insulator film 16 by use of a LPCVD process. Then, the phosphorus-doped polysilicon layer 40 is patterned into an electrode shape by a lithography and a dry etching.

Figure 2B:
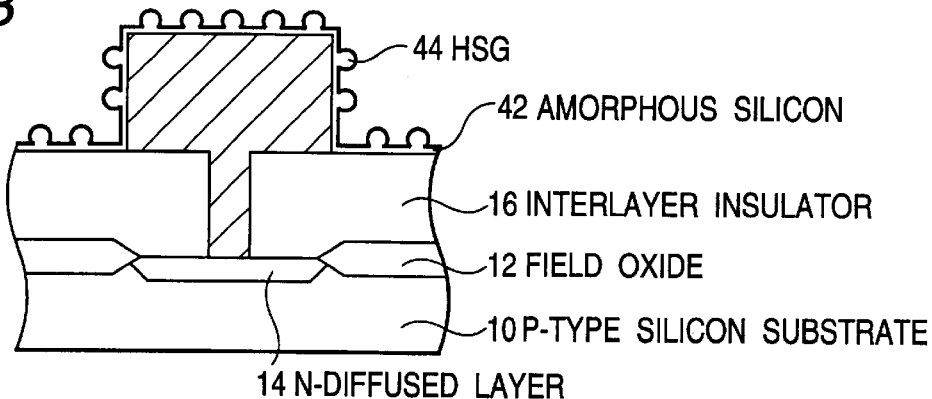

Then, as shown in FIG. 2B, an amorphous silicon film 42 is formed on the whole surface by the LPCVD process, and in a ultra-high vacuum CVD apparatus, a disilane ($Si_2H_6$) is irradiated on the substrate while heat-treating the substrate in a high vacuum condition at a temperature of 500° C. to 600° C., so that silicon crystal nuclei are generated on a surface. Succeedingly, the heat-treatment is continuously performed in the high vacuum condition, so that HSGs 44 having a drain diameter of 30 nm to 40 nm are grown by adjusting the heat-treatment to for example 10 minutes to 15 minutes.

Figure 2C:
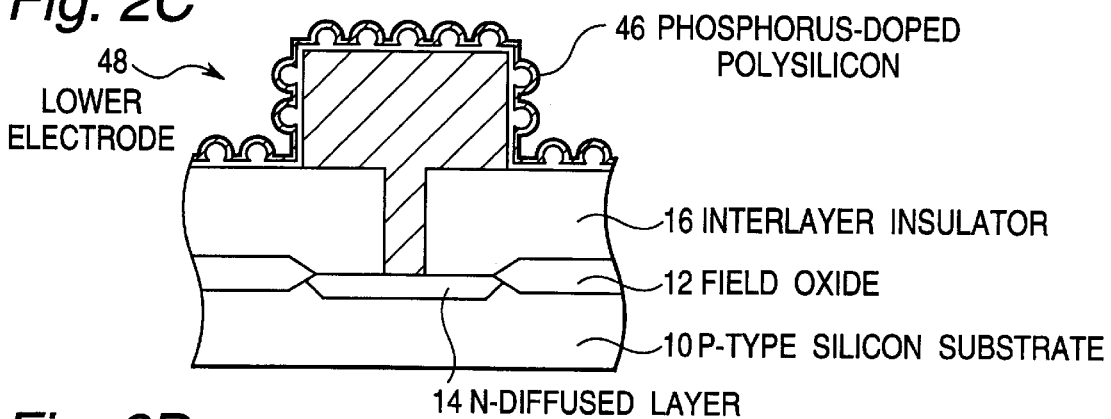

Then, as shown in FIG. 2C, over this structure, a polysilicon film 46 having a thickness of 10 nm to 20 nm and containing a high concentration of phosphorus (for example, on the order of $2 \times 10^{20} cm^{-3}$ to $3 \times 10^{20} cm^{-3}$) is formed by the LPCVD process. Succeedingly, the whole surface etching-back is carried out in a RIE (reactive ion etching) apparatus using an etching gas $Cl_2/HBr$ (100/40 sccm) at an etching pressure of 60 mTorr and a high frequency power of 450 W, so that the HSGs 44 and the phosphorus-doped polysilicon film 46 are removed from the upper surface of the interlayer insulator film 16. Thus, a lower electrode 48 is formed.

Figure 2D:
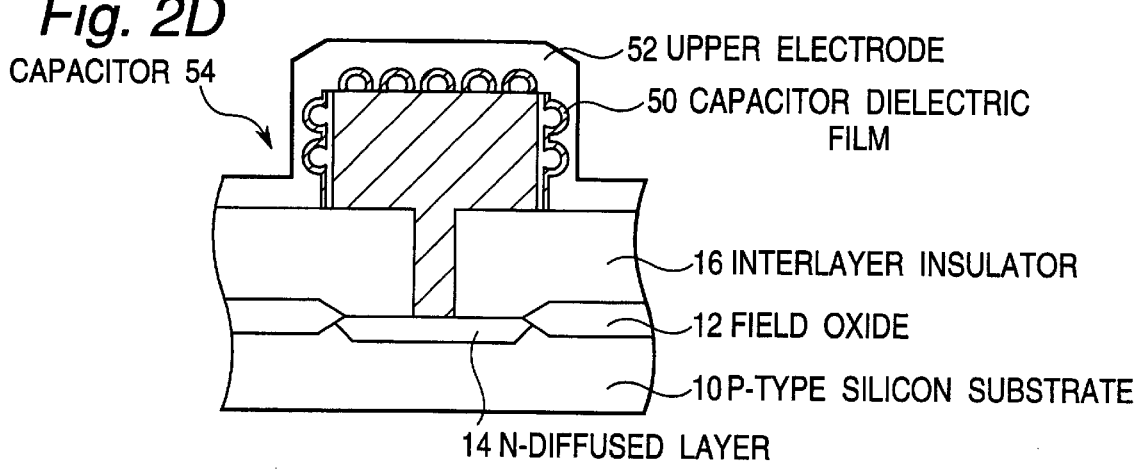

Thereafter, as shown in FIG. 2D, a silicon nitride (SiN) film having a thickness of 8 nm is formed on the lower electrode 48 to form a capacitor dielectric film 50, and succeedingly, a polysilicon layer containing a high concentration of phosphorus (for example, on the order of $2 \times 10^{20} cm^{-3}$) is formed by the LPCVD process to form an upper electrode 52. Thus, a stacked capacitor 54 is fabricated.

Embodiment 3

In the Embodiment 1 and the Embodiment 2, the phosphorus-doped polysilicon film is formed on the HSGs in order to compensate for the impurity concentration at the HSG surface. In this Embodiment 3, phosphorus is heat-diffused into the HSGs from the underlying phosphorus-doped polysilicon 20 under the HSGs.

Figure 3:
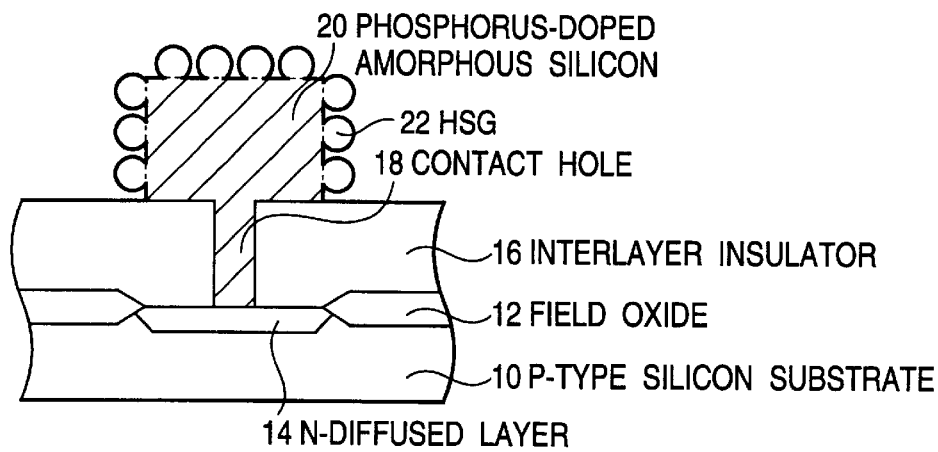
FIG. 3 is a diagrammatic section view for illustrating a process for growing the HSGs and diffusing phosphorus.

FIG. 3 is a diagrammatic section view for illustrating a process for growing the HSGs and diffusing phosphorus. In this process, since phosphorus-doped polysilicon film is not formed on the HSGs, the grain size of the HSGs can be made larger than that in the Embodiment 1 and the Embodiment 2. Since the grain size is determined by the heat-treatment time, silicon crystal nuclei are generated at a heat-treating temperature of 500° C. to 600° C., and then, the heat-treatment of 500° C. to 600° C. is continuously performed for example 15 minutes to 20 minutes, so that HSGs 22 having a drain diameter of 60 nm to 70 nm are grown.

Succeedingly, the heat-treatment is performed in a heating chamber at the temperature of 900° C. to 1000° C. for ten minutes, so as to cause phosphorus to diff-use into the HSGs 22 from the phosphorus-doped polysilicon 20.

Embodiment 4

Even in the case of growing the HSGs on the whole surface as in the Embodiment 2, it is possible to compensate for the impurity concentration at the HSG surface by beat-diffusion of phosphorus similarly to the Embodiment 3, without forming the phosphorus-doped polysilicon film on the HSG surface.

Figure 4:
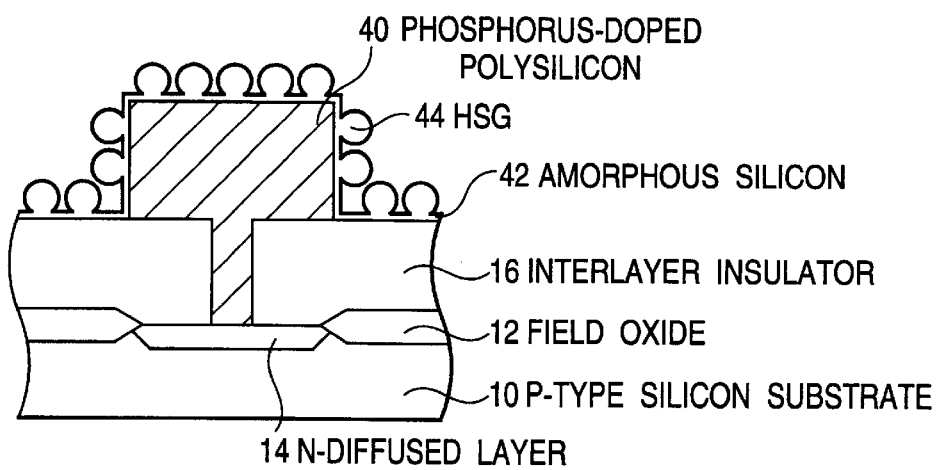
FIG. 4 is a diagrammatic section view for illustrating a process for growing the HSGs and diffusing phosphorus.

FIG. 4 is a diagrammatic section view for illustrating a process for growing the HSGs and diffusing phosphorus. In this process, an amorphous silicon film 42 is formed on the whole surface by the LPCVD process, and in a ultra-high vacuum CVD apparatus, a disilane ($Si_2H_6$) is irradiated on the substrate while heat-treating the substrate in a high vacuum condition at a temperature of 500° C. to 600° C., so that silicon crystal nuclei are generated on a surface. Succeedingly, the heat-treatment is continuously performed in the high vacuum condition by adjusting the heat-treatment to for example 15 minutes to 20 minutes, so that HSGs 44 having a drain diameter of 60 nm to 70 nm are grown.

Succeedingly, the heat-treatment is performed in a heating chamber at the temperature of 900° C. to 1000° C. for ten minutes, so as to cause phosphorus to diffuse into the HSGs 22 from the phosphorus-doped polysilicon layer 40.

Embodiment 5

In the Embodiment 3 and the Embodiment 4, phosphorus is caused to diffuse into the HSGs from the underlying phosphorus-doped polysilicon. However, it is possible to compensate for the impurity concentration at the HSG surface by ion-implanting phosphorus.

Figure 5:
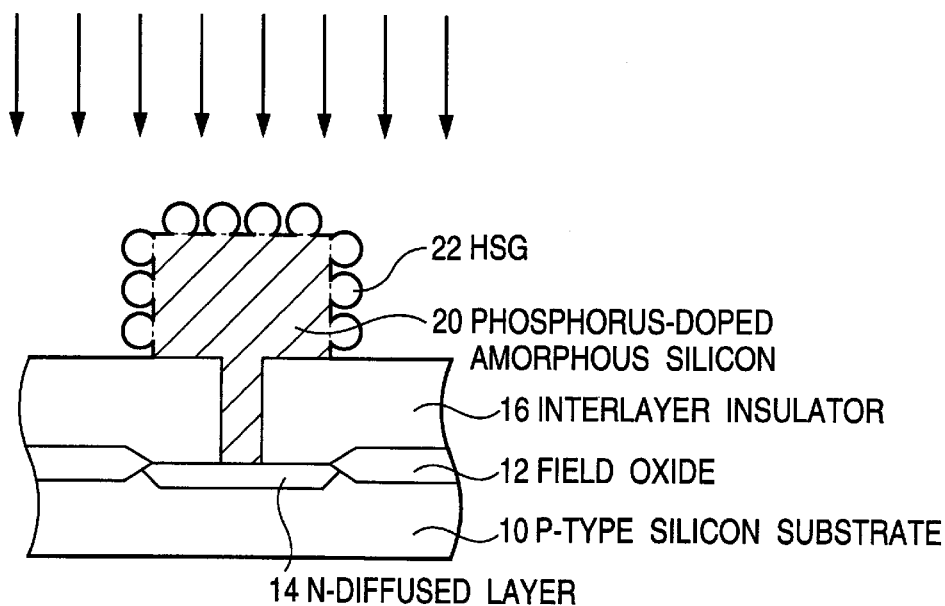
FIG. 5 is a diagrammatic section view for illustrating a process for growing the HSGs and ion-implanting phosphorus.
Figure 6:
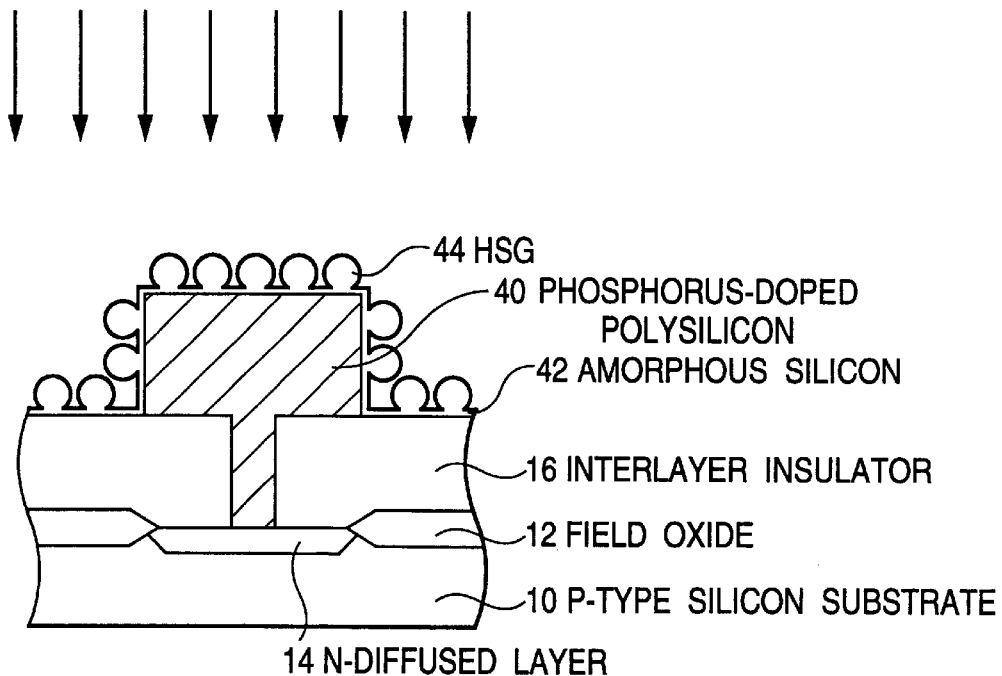
FIG. 6 is a diagrammatic section view for illustrating a process for growing the HSGs and ion-implanting phosphorus.

FIGS. 5 and 6 are diagrammatic section view corresponding to those of FIGS. 3 and 4 but illustrating a process for ion-implanting phosphorus into the HSGs. The condition for the ion implantation is the energy of 40 keV, the dose of $1\times10^{15}$ $cm^2$ to $1\times10^{16}m^2$, the heat treatment of 850° C. and the ion implantation time of 40 minutes. As a result of the ion implantation, the HSGs contain a high concentration of phosphorus.

Embodiment 6

Figure 7:
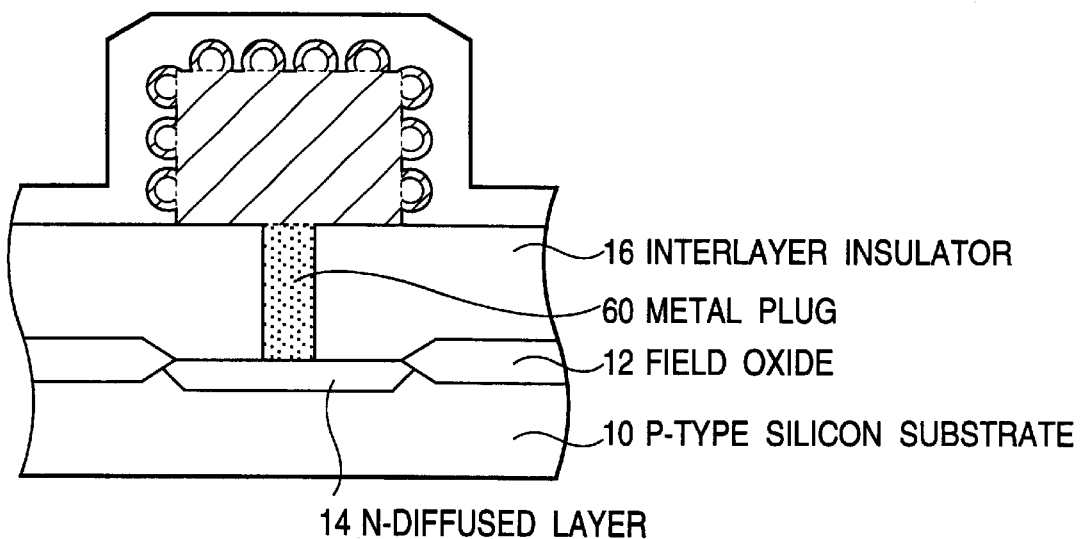
FIG. 7 is a diagrammatic section view for illustrating a DRAM cell having a buried metal plug.

In each of the above mentioned embodiments, the lower electrode of the capacitor and the electrode (source region) of the transistor are interconnected by filling the contact hole of the interlayer insulator film with the amorphous silicon layer or the polysilicon layer which constitutes the lower electrode. As shown in FIG. 7, the lower lectrode of the capacitor and the electrode (source region) of the transistor can be interconnected by a metal plug 60 filled into the contact hole formed in the interlayer insulator film, in place of the silicon layer filled in the contact hole.

Figure 8:
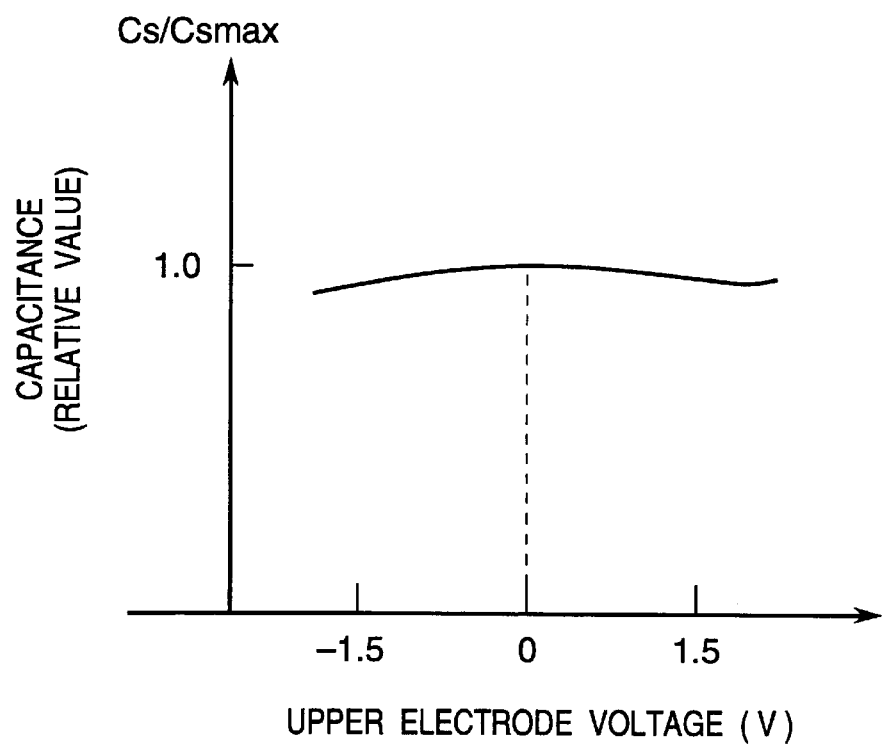
FIG. 8 is a graph for illustrating the bias voltage dependency of the capacitance of the capacitor in the memory cell in accordance with the present invention.
Figure 10:
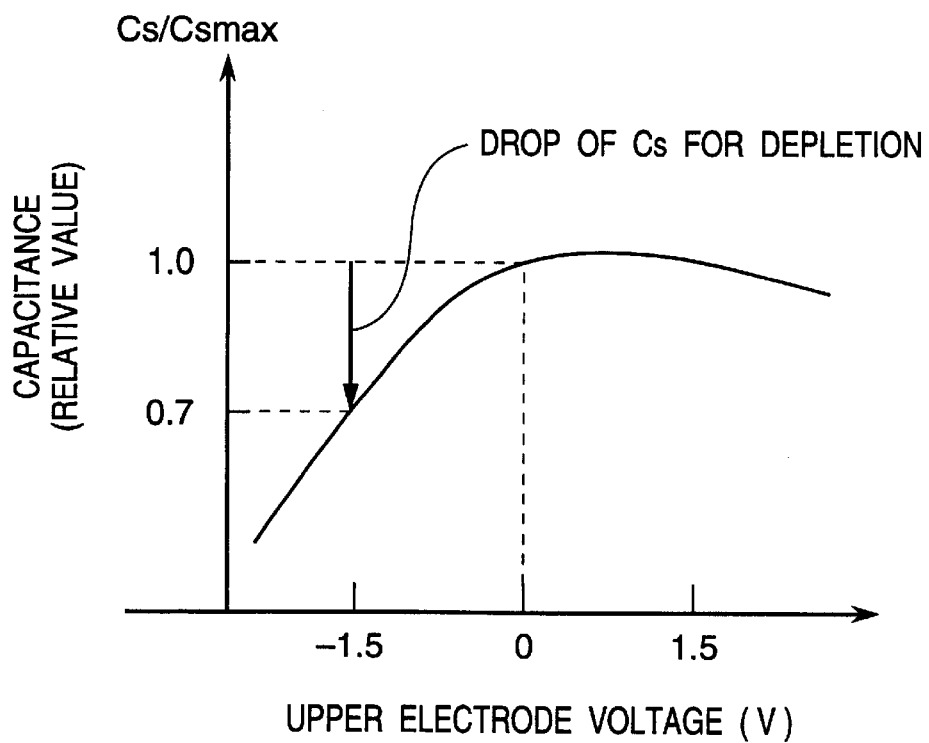
FIG. 10 is a graph for illustrating the bias voltage dependency of the capacitance of the capacitor in the prior art memory cell.

As mentioned above, according to the present invention, in the capacitor included in the stacked structure memory cell and having on the surface the convexes and concaves formed of the crystalline grains, the impurity concentration on the crystalline grain surface is compensated for. Therefore, since at least the surface of the lower electrode of the capacitor has electric conductivity, it is possible to improve the bias voltage dependency of the capacitance. FIG. 8 is a graph for illustrating the bias voltage dependency of the capacitance of the capacitor in the memory cell in accordance with the present invention. As will be apparent from comparison between FIG. 8 and FIG. 10, when the potential of the lower electrode is high, the drop of the capacitance is slight in the stacked capacitor in accordance with the present invention.

Accordingly, according to the present invention, it is possible to provide a stacked capacitor having less bias voltage dependency of the capacitance, and a method for forming the same. In addition, it is also possible to provide the memory cell having such a capacitor. Incidentally, the present invention as mentioned above can be applied to any structure having a capacitor formed over an insulating film.

The invention has thus been shown and described with reference to the specific embodiments. However, it should be noted that the present invention is in no way limited to the details of the illustrated structures but changes and modifications may be made within the scope of the appended claims.

What is claimed is:

1. A method for fabricating a semiconductor device including a stacked structure memory cell having a transistor and a capacitor stacked over the transistor, wherein a lower electrode of opposing electrodes of said capacitor is formed, said method comprising:
    (a) forming a high-concentration impurity-doped amorphous silicon layer on an interlayer insulator film and patterning the amorphous silicon layer into an electrode shape;
    (b) generating crystal nuclei on a surface of the patterned amorphous silicon layer and growing said crystal nuclei to form crystalline grains of silicon on an upper surface and a side surface of the patterned amorphous silicon layer; and
    (c) compensating for a lowered impurity concentration at a surface of said crystalline grains caused by said growing of said crystalline grains.

2. A method claimed in claim 1 wherein said compensating for the impurity concentration further comprises forming a high-concentration impurity-doped polysilicon film on said crystalline grains and the amorphous silicon layer.

3. A method claimed in claim 1 wherein said compensating for the impurity concentration further comprises heat-diffusing the impurity into said crystalline grains from the amorphous silicon layer.

4. A method claimed in claim 1 wherein said compensating for the impurity concentration further comprises ion-implanting the impurity into said crystalline grains.

5. A method claimed in claim 1 wherein said impurity is phosphorus.

6. A method for fabricating a semiconductor device including a stacked structure memory cell having a transistor and a capacitor stacked over the transistor, wherein a lower electrode of opposing electrodes of said capacitor is formed, said method comprising:
    (a) forming a high-concentration impurity-doped polysilicon layer on an interlayer insulator film and patterning the polysilicon layer into an electrode shape;
    (b) forming an amorphous silicon film on said interlayer insulator film and on an upper surface and a side surface of the patterned polysilicon layer;
    (c) generating crystal nuclei on a surface of said amorphous silicon film and growing said crystal nuclei to form crystalline grains of silicon on an upper surface and a side surface of said amorphous silicon film; and
    (d) compensating for a decreased impurity concentration at a surface of said crystalline grains caused by said growing of said crystalline grains.

7. A method claimed in claim 6 wherein said compensating for the impurity concentration further comprises forming a high-concentration impurity-doped silicon film on said crystalline grains and said amorphous silicon film.

8. A method claimed in claim 7 further comprising: removing said crystalline grains and said high-concentration impurity-doped silicon film from the surface of said interlayer insulator film.

9. A method claimed in claim 6 wherein said compensating for the impurity concentration further comprises heat-diffusing the impurity into said crystalline grains from the polysilicon layer.

10. A method claimed in claim 6 wherein said compensating for the impurity concentration further comprises ion-implanting the impurity into said crystalline grains.

11. A method claimed in claim 6 wherein said impurity is phosphorus.

12. A method for forming a capacitor formed on an insulator film, wherein a lower electrode of opposing electrodes of said capacitor is formed, said method comprising:
    (a) forming a high-concentration impurity-doped amorphous silicon layer on said insulating film and patterning the amorphous silicon layer into an electrode shape;
    (b) generating crystal nuclei on a surface of the patterned amorphous silicon layer and growing said crystal nuclei to form crystalline grains of silicon on an upper surface and a side surface of the patterned amorphous silicon layer; and
    (c) compensating the impurity concentration at a surface of said crystalline grains for a decreased level caused by said growing process.

13. A method claimed in claim 12, wherein said compensating for the impurity concentration further comprises forming a high-concentration impurity-doped polysilicon film on said crystalline grains and the amorphous silicon layer.

14. A method claimed in claim 12 wherein said step compensating for the impurity concentration further comprises heat-diffusing the impurity into said crystalline grains from the amorphous silicon layer.

15. A method claimed in claim 12 wherein said compensating for the impurity concentration further comprises ion-implanting the impurity into said crystalline grains.

16. A method claimed in claim 12 wherein said impurity is phosphorus.

17. A method for forming a capacitor formed on an insulating film, wherein a lower electrode of opposing electrodes of said capacitor is formed, said method comprising:
    (a) forming a high-concentration impurity-doped polysilicon layer on said insulating film and patterning the polysilicon layer into an electrode shape;
    (b) forming an amorphous silicon film on said insulating film and on an upper surface and a side surface of the patterned polysilicon layer;
    (c) generating crystal nuclei on a surface of said amorphous silicon film and growing said crystal nuclei to form crystalline grains of silicon on an upper surface and a side surface of side amorphous silicon film; and
    (d) compensating the impurity concentration at a surface of said crystalline grains for concentration losses caused by said growing process.

18. A method claimed in claim 17 wherein said compensating for the impurity concentration further comprises forming a high-concentration impurity-doped silicon film on said crystalline grains and said amorphous silicon film.

19. A method claimed in claim 18 further comprising removing said crystalline grains and said high-concentration impurity-doped silicon film from the surface of said insulating film.

20. A method claimed in claim 17 wherein said compensating for the impurity concentration further comprises heat-diffusing the impurity in said crystalline grains from the polysilicon layer.

21. A method claimed in claim 17 wherein said compensating for the impurity concentration further comprises ion-implanting the impurity into said crystalline grains.

22. A method claimed in claim 17 wherein said impurity is phosphorus.

* * * * *